(12) United States Patent
Yeh et al.

(10) Patent No.: US 11,777,393 B2
(45) Date of Patent: Oct. 3, 2023

(54) CURRENT DETECTION CIRCUIT AND CURRENT DETECTION METHOD

(71) Applicant: DELTA ELECTRONICS, INC., Taoyuan (TW)

(72) Inventors: Yung-Sheng Yeh, Taoyuan (TW); Hsiang-Sheng Hung, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 65 days.

(21) Appl. No.: 17/534,902

(22) Filed: Nov. 24, 2021

(65) Prior Publication Data

US 2022/0416641 A1 Dec. 29, 2022

(30) Foreign Application Priority Data

Jun. 25, 2021 (CN) .......................... 202110710988.0

(51) Int. Cl.
*H02M 3/335* (2006.01)
*H02M 1/00* (2006.01)
*H02M 1/42* (2007.01)

(52) U.S. Cl.
CPC ....... *H02M 1/0009* (2021.05); *H02M 1/4208* (2013.01); *H02M 3/33576* (2013.01)

(58) Field of Classification Search
CPC ..... H02M 1/0009; H02M 1/42; H02M 1/4208
See application file for complete search history.

(56) References Cited

U.S. PATENT DOCUMENTS 9,941,784 B1* 4/2018 Li .......................... G01R 15/183
2021/0215746 A1* 7/2021 Xu ........................ H02M 1/0009

\* cited by examiner

*Primary Examiner* — Alex Torres-Rivera
(74) *Attorney, Agent, or Firm* — Muncy, Geissler, Olds & Lowe, P.C.

(57) ABSTRACT

A detection circuit is used to detect an input current of a switching power conversion circuit. The current detection circuit includes a current transform unit, a first unidirectional conduction component assembly, a flux reset circuit, a second unidirectional conduction component assembly, a first switch, a second switch, a control unit, and a detection unit. The current transform unit is coupled to a power switch of the switching power conversion circuit, and the first unidirectional conduction component assembly, the flux reset circuit, and the second unidirectional conduction component assembly are connected in parallel to the current transform unit. The first switch and the second switch are coupled to the first or second unidirectional conduction component assembly, and the control unit correspondingly controls the first switch and the second switch according to a first or second direction voltage of the input voltage.

18 Claims, 14 Drawing Sheets

CURRENT DETECTION CIRCUIT AND CURRENT DETECTION METHOD

BACKGROUND

Technical Field

The present disclosure relates to a current detection circuit and a current detection method, and more particularly to a universal current detection circuit and current detection method.

Description of Related Art

The statements in this section merely provide background information related to the present disclosure and do not necessarily constitute prior art.

As the power quality is increasingly required in the current power field, more and more electronic devices will install power factor correction (PFC) circuits at the input terminals to improve power quality. Since the power factor correction circuit mainly controls the waveform of the input current to follow the waveform of the input voltage, a current detection circuit is necessary to acquire the waveform of the input current to facilitate the switching control of the power factor correction circuit. However, most of the current detection circuits used in general power factor correction circuits have limitations in their use. The main difference depends on different types and structures of power factor correction circuits, and the methods of controlling switches of bridge or bridgeless circuits are different, and therefore the current detection circuits of these two circuit structures are incompatible. Therefore, a specific current detection circuit must be used to correctly detect the input current, and the control is more complicated and cumbersome.

As shown in FIG. 1, the main reason for the incompatibility of the current detection circuit is that it is necessary to consider whether the current transformer CT will be saturated, and the saturation mainly comes from the lack of a suitable flux reset path. However, to achieve a proper flux reset path will inevitably increase the difficulty of control, or increase the complexity of the circuit itself. The current detection circuit of the bridge rectifier with power factor correction circuit is usually not shared with the current detection circuit of the bridgeless power factor correction circuit. Since the current detection circuit for bridgeless structure needs to determine the positive and negative half cycle signals by itself, it requires two sets of current transformers CT to detect the positive and negative half cycles separately, thereby increasing the size of the volume.

SUMMARY

In order to solve the above-mentioned problems, the present disclosure provides a current detection circuit. The current detection circuit detects an input current of a switching power conversion circuit. The current detection circuit includes a current transform unit, a first unidirectional conduction component assembly, a flux reset circuit, a second unidirectional conduction component assembly, a first switch, a second switch, a control unit, and a detection unit. The current transform unit has a primary-side winding and a secondary-side winding, and the primary-side winding is coupled to a power switch of the switching power conversion circuit. The first unidirectional conduction component assembly is connected to the secondary-side winding in parallel, includes a first unidirectional conduction component and a second unidirectional conduction component reversely connected in series at a first node. The flux reset circuit is connected to the secondary-side winding in parallel, and provides a flux reset path of the current transform unit. The second unidirectional conduction component assembly is connected to the secondary-side winding in parallel, includes a third unidirectional conduction component and a fourth unidirectional conduction component reversely connected in series. The third unidirectional conduction component is coupled to the first unidirectional conduction component with opposite polarity, and the third unidirectional conduction component and the fourth unidirectional conduction component are connected at a second node. The first switch is connected to the first unidirectional conduction component or the fourth unidirectional conduction component in series. The second switch is connected to the second unidirectional conduction component or the third unidirectional conduction component in series.

The control unit turns on or turns off the first switch and the second switch. The detection unit is coupled to the first node and the second node.

In order to solve the above-mentioned problems, the present disclosure provides a current detection method. The current detection method controls a current detection circuit to detect an input current of a switching power conversion circuit. The current detection circuit includes a current transform unit, a flux reset circuit, a first unidirectional conduction component and a second unidirectional conduction component reversely connected in series, a third unidirectional conduction component and a fourth unidirectional conduction component reversely connected in series, a first switch, and a second switch. The current detection method includes steps of: turning on the first switch according to a first direction of an input voltage of the switching power conversion circuit to generate a first current path formed by the current transform unit, the first unidirectional conduction component, and the fourth unidirectional conduction component, and a first flux reset path formed through the flux reset circuit from the current transform unit; turning on the second switch according to a second direction of the input voltage to generate a second current path formed by the current transform unit, the second unidirectional conduction component, and the third unidirectional conduction component, and a second flux reset path formed through the flux reset circuit from the current transform unit; measuring a cross voltage between a first node between the first unidirectional conduction component and the second unidirectional conduction component and a second node between the third unidirectional conduction component and the fourth unidirectional conduction component to acquire the input current corresponding to the cross voltage. The first direction and the second direction are in the opposite direction of a zero voltage.

The main purpose and effect of the present disclosure is that since the universal current detection circuit can detect only one single half cycle or the entire AC sine wave input current through one single specific current unit, any current detection circuit may provide a specific current path and a flux reset path. Therefore, it can be compatible with various power factor correction circuit structures, and can also be used in common with DC conversion circuits so as to achieve simple circuit itself, reduce circuit cost and volume, and easier control.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
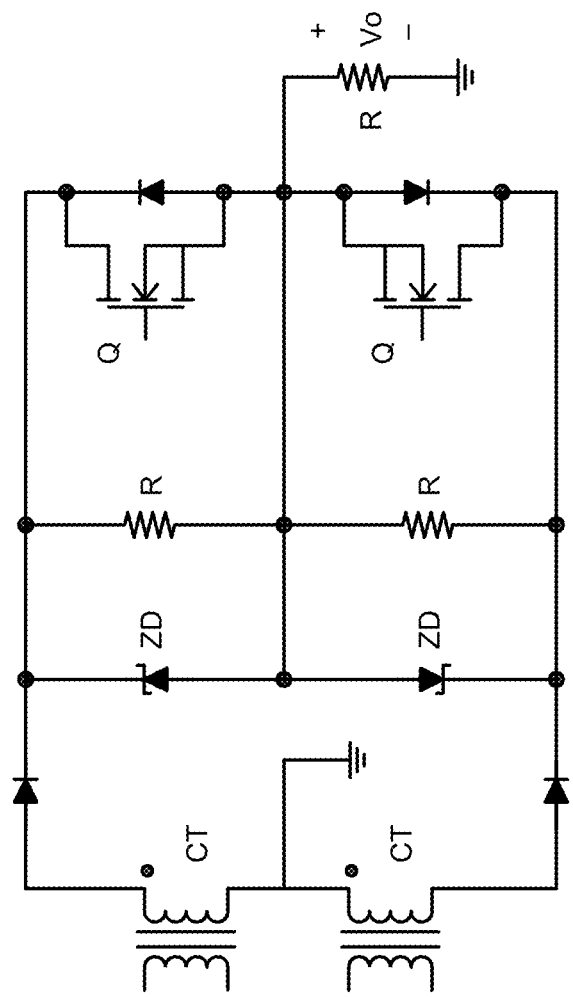
FIG. 1 is a block circuit diagram of a conventional current detection circuit.

Reference will now be made to the drawing figures to describe the present disclosure in detail. It will be understood that the drawing figures and exemplified embodiments of present disclosure are not limited to the details thereof.

Figure 2:
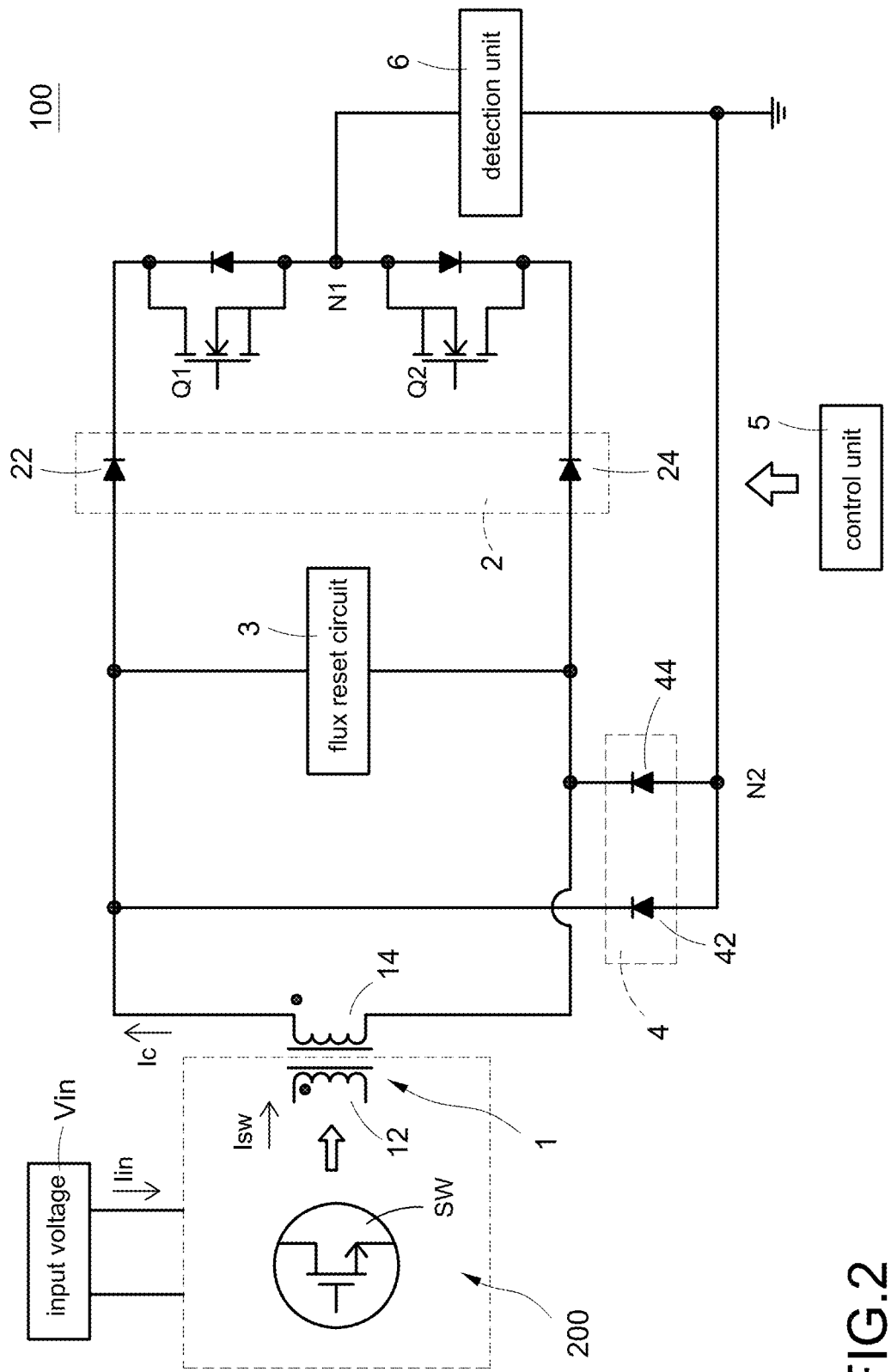
FIG. 2 is a block circuit diagram of a current detection circuit according to the present disclosure.

Please refer to FIG. 2, which shows a block circuit diagram of a current detection circuit according to the present disclosure, and also refer to FIG. 1. The current detection circuit 100 is coupled to a power factor correction circuit or a DC conversion circuit (here are collectively referred to as a switching power conversion circuit 200), and is used to detect an input current Iin of the switching power conversion circuit 200. The current detection circuit 100 is coupled to a power switch SW of the switching power conversion circuit 200 (the details will be further explained later) to operation by switching the power switch SW. The current detection circuit 100 includes a current transform unit 1, a first unidirectional conduction component assembly 2, a flux reset circuit 3, a second unidirectional conduction component assembly 4, a first switch Q1, a second switch Q2, and a control unit 5. A primary-side winding 12 of the current transform unit 1 is coupled in series to the power switch SW of the switching power conversion circuit 200 to generate a coupling current Ic in the secondary-side winding 14 of the current transform unit 1. In particular, the current transform unit 1 may be an inductive component such as a current transformer, a coupling inductor, etc., which is used to induce current through coupling.

The first unidirectional conduction component assembly 2 is coupled to the secondary-side winding 14 of the current transform unit 1 in parallel, and includes a first unidirectional conduction component 22 and a second unidirectional conduction component 24 reversely connected in series. The flux reset circuit 3 is coupled to the secondary-side winding 14 of the current transform unit 1 in parallel, and provides a flux reset path when the current transform unit 1 resets flux. The second unidirectional conduction component assembly 4 is coupled to the secondary-side winding 14 of the current transform unit 1 in parallel, and includes a third unidirectional conduction component 42 and a fourth unidirectional conduction component 44 reversely connected in series. The first unidirectional conduction component 22 and the second unidirectional conduction component 24 are connected at a first node N1, and the third unidirectional conduction component 42 and the fourth unidirectional conduction component 44 are connected at a second node N2. The first unidirectional conduction component 22 is coupled to the third unidirectional conduction component 42 with opposite polarity, that is, the polarities of the first and third unidirectional conduction components 22,42 coupled at the common node are opposite. The second unidirectional conduction component 24 is coupled to the fourth unidirectional conduction component 44 with opposite polarity, that is, the polarities of the second and fourth unidirectional conduction components 24,44 coupled at the common node are opposite. In one embodiment, the unidirectional conduction component is, for example but not limited to, a diode. All electronic components that can provide unidirectional conduction, for example but not limited to components such as silicon controlled rectifiers (SCRs) and thyristors should be included in the scope of this embodiment. Moreover, if the connection directions of the first, second, third, and fourth unidirectional conduction components 22,24,42,44 are just opposite to those shown in FIG. 2, another embodiment can be implemented for detecting the input current Iin, and the detail description is omitted here for conciseness.

The first switch Q1 may be selectively coupled in series to both sides of the first unidirectional conduction component 22 or both sides of the fourth unidirectional conduction component 44. The second switch Q2 may be selectively coupled in series to both sides of the second unidirectional conduction component 24 or both sides of the third unidirectional conduction component 42 (the details will be further explained later). The control unit 5 correspondingly controls the first switch Q1 and the second switch Q2 according to a first direction voltage (for example but not limited to a positive voltage) or a second direction voltage (for example but not limited to a negative voltage) of the input voltage Vin of the switching power conversion circuit 200. In particular, the first direction and the second direction are in the opposite direction of a zero voltage. That is, if the first direction voltage is the positive voltage, the second direction voltage is the negative voltage in the opposite direction of the zero voltage, and vice versa. The control unit 5 correspondingly turns on the first switch Q1 or the second switch Q2 according to the positive or negative input voltage Vin so that the first switch Q1 and the second switch Q2 are responsible for the current detection of the unidirectional voltage.

Specifically, the current detection circuit can be used to detect the input current Iin of an AC/DC or DC/DC switching converter. The switching AC/DC converter may preferably be a power factor correction circuit, and the first direction voltage and the second direction voltage mainly mean that a positive half cycle and a negative half cycle of the input voltage Vin. The control unit 5 correspondingly turns on the first switch Q1 or the second switch Q2 according to the positive half cycle or the negative half cycle of the input voltage Vin, that is, a single switch is responsible for a single half cycle. The switching DC/DC converter may be a DC conversion circuit, and the first direction voltage and the second direction voltage mainly mean a positive voltage and a negative voltage of the input voltage Vin. The control unit 5 correspondingly turns on the first switch Q1 or the second switch Q2 according to the positive voltage or the negative voltage of the input voltage Vin. When the input voltage Vin has only a single direction voltage (for example, only a positive voltage), only a single switch is continuously turned on.

A detection unit 6 is between the first node N1 and the second node N2. When a current flows through the first node N1 and the second node N2, a cross voltage Vr is produced at two ends of the detection unit 6. When the control unit 5 turns on the first switch Q1 or the second switch Q2, the current flows two ends of the first node N1 and the second node N2 to produce the cross voltage Vr. The cross voltage Vr is corresponding to a magnitude of the input current tin. Therefore, the magnitude of the input current Iin can be accurately acquired by detecting the cross voltage Vr. In one embodiment, the first switch Q1 and the second switch Q2 may be semiconductor components that can be used as switches, such as MOSFETs, IGBTs, or BJTs, and the preferred embodiment is MOSFETs with high switching frequency. Moreover, the control unit 5 includes at least one sensor and a controller (not shown). The at least one sensor is used to sense (detect) the input voltage Vin or the input current Iin, and the controller may be an analog-digital controller composed of a circuit, a chip or microcircuit component such as a microcontroller controlled by a write program.

Figure 3:
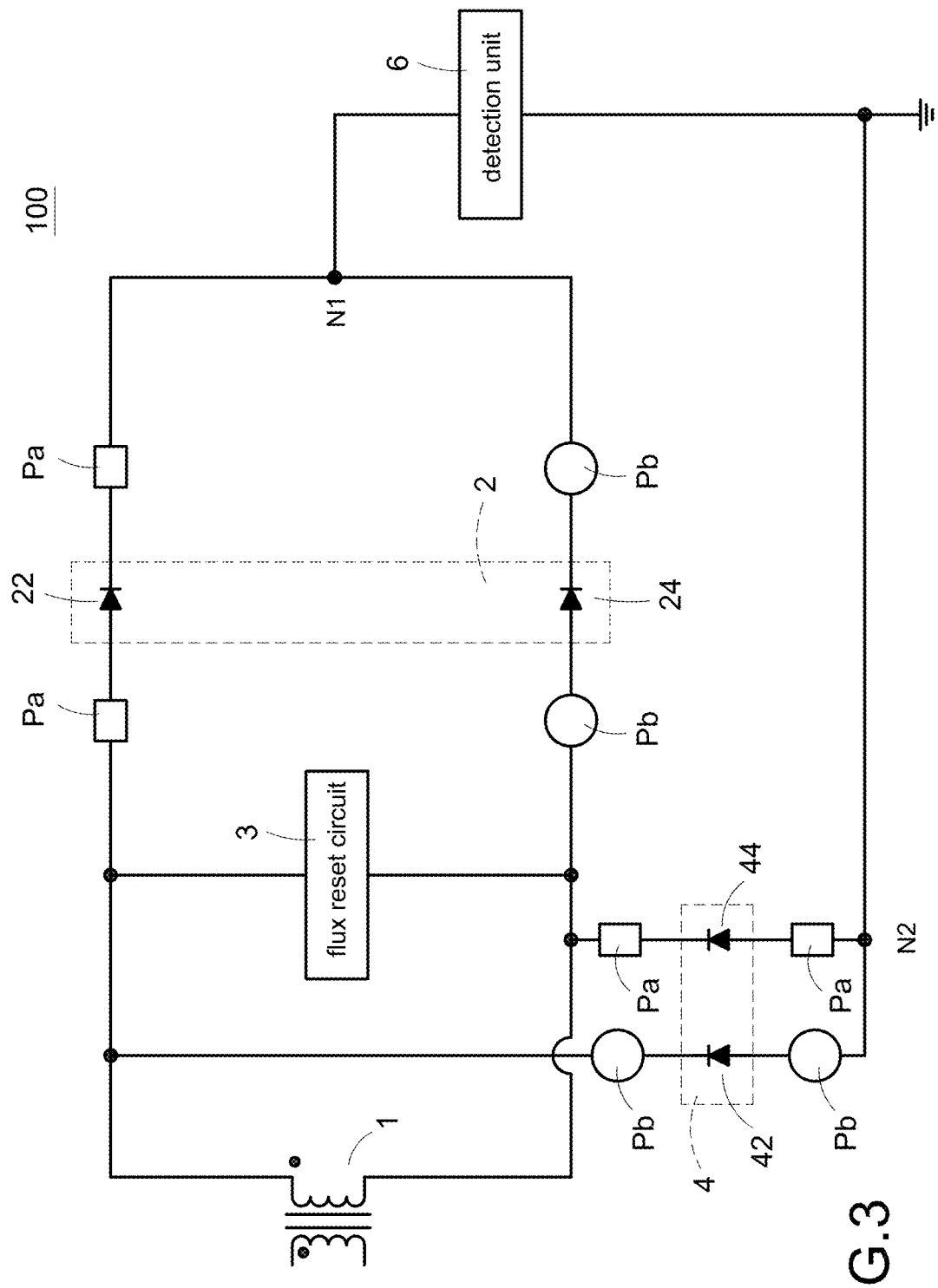
FIG. 3 is a block circuit diagram of coupling positions of a first switch and a second switch according to the present disclosure.

Please refer to FIG. 3, which shows a block circuit diagram of coupling positions of a first switch and a second switch according to the present disclosure, and also refer to FIG. 1 and FIG. 2. The first switch Q1 may be coupled at one of four positions Pa, that is, the first switch Q1 may be coupled in series to front or rear of the first unidirectional conduction component 22 or the first switch Q1 may be coupled in series to front or rear of the fourth unidirectional conduction component 44. Specifically, the first coupling position Pa is between a first end of the secondary-side winding 14 of the current transform unit 1 and the first unidirectional conduction component 22, the second coupling position Pa is between the first unidirectional conduction component 22 and the first node N1, the third coupling position Pa is between the second node N2 and the fourth unidirectional conduction component 44, and the fourth coupling position Pa is between the fourth unidirectional conduction component 44 and a second end of the secondary-side winding 14 of the current transform unit 1. Similarly, the second switch Q2 may be coupled at one of four positions Pb, that is, the second switch Q2 may be coupled in series to front or rear of the second unidirectional conduction component 24 or the second switch Q2 may be coupled in series to front or rear of the third unidirectional conduction component 42. The specific position is similar to the first switch Q1, and the detail description is omitted here for conciseness.

Figure 4A:
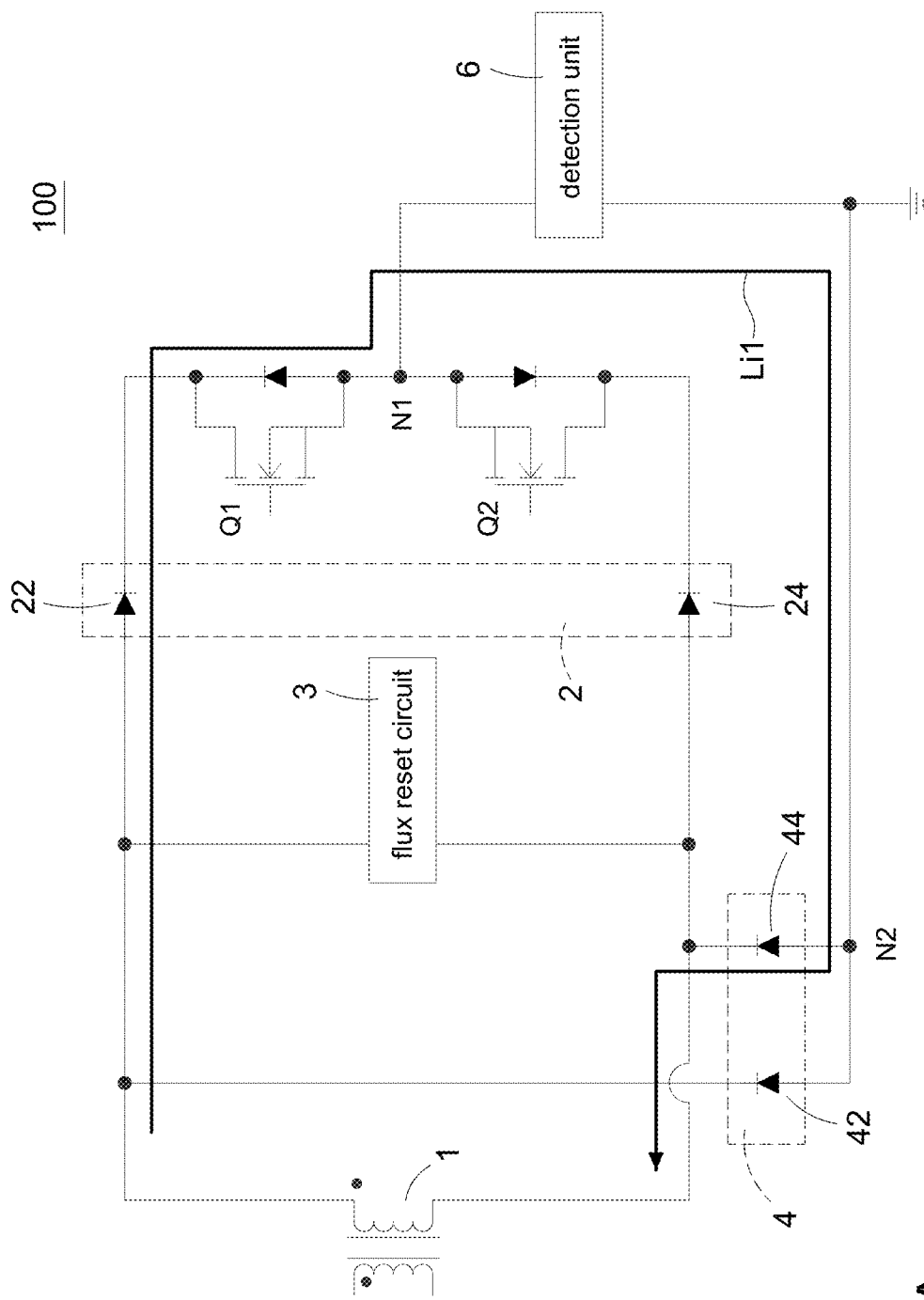
FIG. 4A is a block circuit diagram of showing a current path when the first switch is turned on by a control unit according to the present disclosure.
Figure 4B:
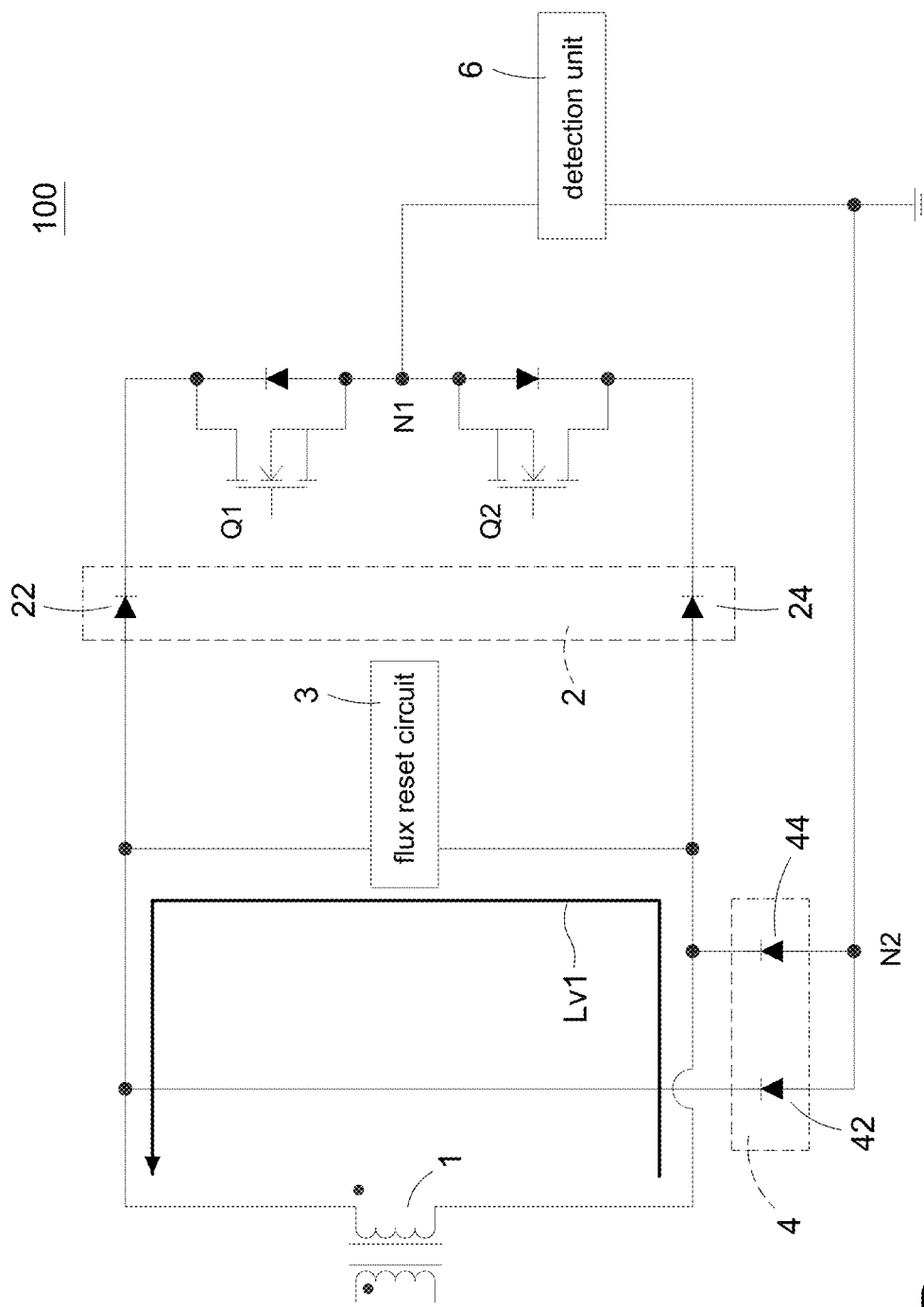
FIG. 4B is a block circuit diagram of showing a flux reset path when the first switch is turned on by the control unit according to the present disclosure.
Figure 4C:
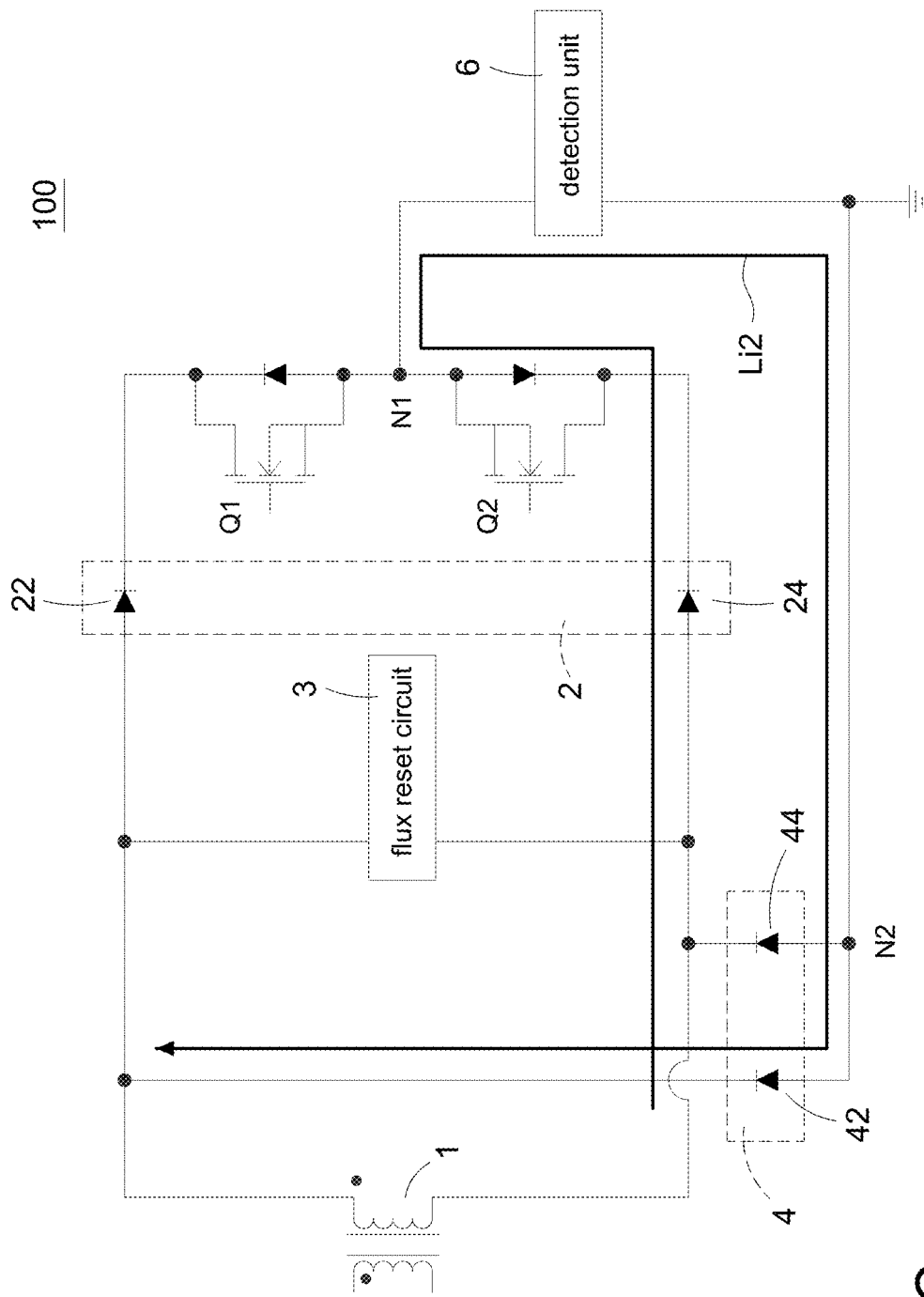
FIG. 4C is a block circuit diagram of showing a current path when the second switch is turned on by the control unit according to the present disclosure.
Figure 4D:
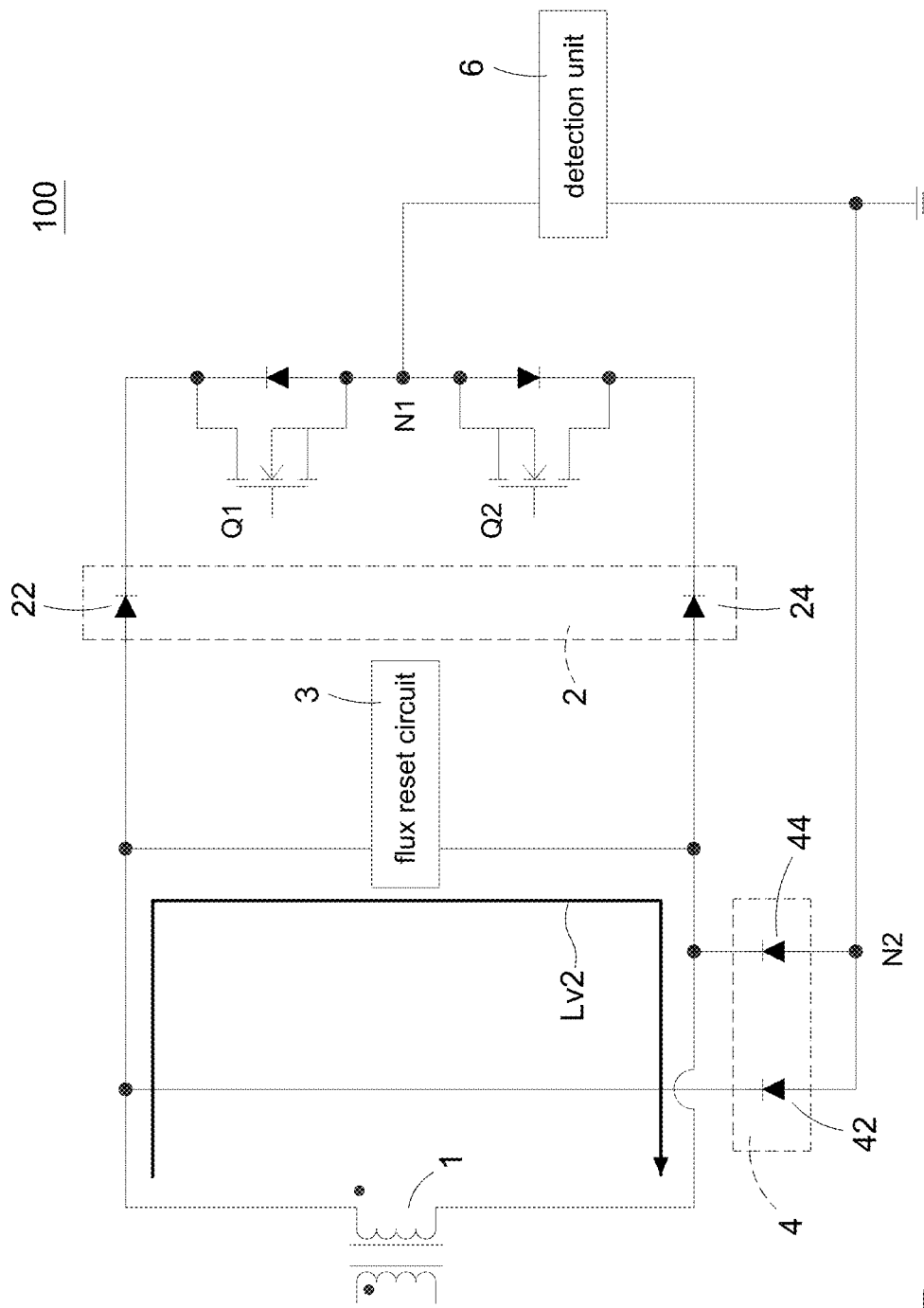
FIG. 4D is a block circuit diagram of showing a flux reset path when the second switch is turned on by the control unit according to the present disclosure.

Please refer to FIG. 4A, which shows a block circuit diagram of showing a current path when the first switch is turned on by a control unit according to the present disclosure, FIG. 4B, which shows a block circuit diagram of showing a flux reset path when the first switch is turned on by the control unit according to the present disclosure, FIG. 4C, which shows a block circuit diagram of showing a current path when the second switch is turned on by the control unit according to the present disclosure, and FIG. 4D, which shows a block circuit diagram of showing a flux reset path when the second switch is turned on by the control unit according to the present disclosure. Take one of the switch coupling positions in FIG. 3 as an example. It is assumed that a first direction voltage is a positive value voltage and a second direction voltage is a negative value voltage.

Specifically, in FIG. 4A, the control unit 5 turns on the first switch Q1 and turns off the second switch Q2 according to the first direction voltage. Also, the first unidirectional conduction component 22 and the fourth unidirectional conduction component 44 are cooperated with the first switch Q1 and the second switch Q2 to form a first current path Li1. Specifically, the first current path Li1 is formed from the first end of the secondary-side winding 14 of the current transform unit 1, the first unidirectional conduction component 22, the first switch Q1, the first node N1, the detection unit 6, the second node N2, the fourth unidirectional conduction component 44, to the second end of the secondary-side winding 14. Since the power switch SW of the switching power conversion circuit 200 is continuously switched on and off according to the pulse width modulation (PWM) signal, and the current direction of the coupling current Ic changes when the power switch SW is turned off, although the control unit 5 continuously turns on the first switch Q1 and turns off the second switch Q2, the flux reset circuit 3 provides a first flux reset path Lv1 from the second end of the secondary-side winding 14 through the flux reset circuit 3 shown in FIG. 4B, thereby avoiding the saturation of the current transform unit 1.

When the power switch SW is turned on and turned off, the current transform unit 1 also correspondingly couples the switch current Isw to the coupling current Ic. However, when the power switch SW is turned off, the remaining energy on the current transformer unit 1 must be released as quickly as possible to avoid saturation current of the current transform unit 1, thereby avoiding the risk of overcurrent damage to the internal components of the current detection circuit 100. Therefore, when the power switch SW is turned off, the flux reset circuit 3 provides the first flux reset path Lv1 so that the energy remaining on the current transform unit 1 can be quickly released through the flux reset circuit 3.

In FIG. 4C, the control unit 5 turns on the second switch Q2 and turns off the first switch Q1, and the second unidirectional conduction component 24 and the third unidirectional conduction component 42 are cooperated with the first switch Q1 and the second switch Q2 to form a second current path Li2. Specifically, the second current path Li2 is formed from the second end of the secondary-side winding 14 of the current transform unit 1, the second unidirectional conduction component 24, the second switch Q2, the first node N1, the detection unit 6, the second node N2, the third unidirectional conduction component 42, to the first end of the secondary-side winding 14. As shown in FIG. 4D, although the control unit 5 continuously turns on the second switch Q2 and turns off the first switch Q1, the flux reset circuit 3 provides a second flux reset path Lv2 from the first end of the secondary-side winding 14 through the flux reset circuit 3, thereby avoiding the saturation of the current transform unit 1. In particular, when the direction of the first unidirectional conduction component 22, that of the second unidirectional conduction component 24, that of the third unidirectional conduction component 42, and that of the fourth unidirectional conduction component 44 are in the opposite direction in FIG. 4A to FIG. 4D, the current paths and the flux reset paths are also just opposite, and the detail description is omitted here for conciseness.

In FIG. 4B and FIG. 4D, when the current transform unit 1 resets flux, the current detection circuit 100 will only generate a single first flux reset path Lv1 or a single second flux reset path Lv2, and therefore there will be no extra path to flow the current through the first node N1 to the second node N2. Accordingly, compared with the conventional current detection circuit, the current detection circuit 100 of the present disclosure can improve the accuracy of current detection. Moreover, there is no need to add a compensation circuit to compensate for the current detection inaccuracy due to the existence of additional current paths.

Figure 5B:
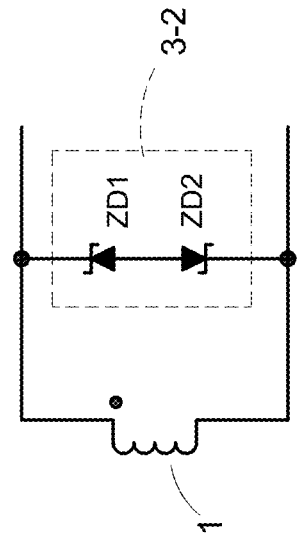
FIG. 5B is a circuit diagram of the flux reset circuit according to a second embodiment of the present disclosure.
Figure 5C:
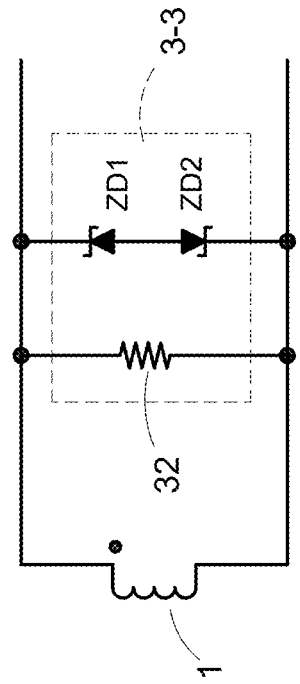
FIG. 5C is a circuit diagram of the flux reset circuit according to a third embodiment of the present disclosure.
Figure 5A:
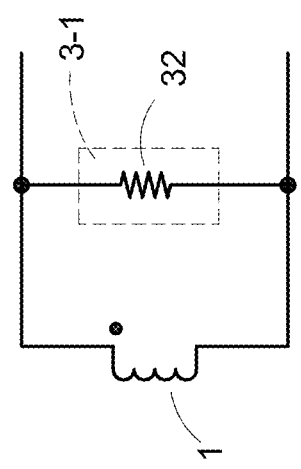
FIG. 5A is a circuit diagram of a flux reset circuit according to a first embodiment of the present disclosure.

Please refer to FIG. 5A, which shows a circuit diagram of a flux reset circuit according to a first embodiment of the present disclosure, FIG. 5B, which shows a circuit diagram of the flux reset circuit according to a second embodiment of the present disclosure, FIG. 5C, which shows a circuit diagram of the flux reset circuit according to a third embodiment of the present disclosure, and also refer to FIG. 1 to FIG. 4D. In FIG. 5A, a flux reset circuit 3-1 may be a resistor 32 for releasing the energy remaining on the current transform unit 1 as quickly as possible. However, the resistor 32 is likely to generate heat due to excessive current so the resistor 32 is more commonly used in low-power circuits.

As shown in FIG. 5B, the flux reset circuit 3-2 includes a first Zener diode ZD1 and a second Zener diode ZD2. The first Zener diode ZD1 and the second Zener diode ZD2 are connected in series in an opposite-polarity manner. Specifically, when the flux reset path is the first flux reset path Lv1, the second Zener diode ZD2 reversely breaks down, and the first Zener diode ZD1 forwardly turns on (the forward turned-on voltage is about 0.5 volts). Therefore, a first clamping voltage Vc1 is generated at two ends of the flux reset circuit 3-2. The first clamping voltage Vc1 will clamp the voltage at two ends of the flux reset circuit 3-2 (the forward turned-on voltage is ignored) so as to protect other electronic components of the current detection circuit 100, thereby avoiding the generation of overvoltage at the moment of flux reset. Otherwise, when the flux rest path is the second flux reset path Lv2 shown in FIG. 4D, the first Zener diode ZD1 reversely breaks down and the second Zener diode ZD2 forwardly turns on to generate a second clamping voltage Vc2, and the other electronic components of the current detection circuit 100 can be protected. In one embodiment, the direction of the first Zener diode ZD1 and that of the second Zener diode ZD2 may be exactly opposite to that of FIG. 5B, which can also provide a flux reset path and can also protect other electronic components of the current detection circuit 100.

In FIG. 5C, the flux reset circuit 3-3 is usually used in high-power circuits, and the flux reset circuit 3-3 includes a first Zener diode ZD1 and a second Zener diode ZD2 connected in series in an opposite-polarity manner, and a flux reset resistor 32 connected in parallel with the series-connected diodes. The flux reset circuit 3-3 provides two parallel-connected flux reset paths so that the current transform unit 1 can completely and quickly reset flux through the flux reset resistor 32. However, due to the high power, a large voltage will be induced. In order to protect the components in the circuit and achieve effective resetting flux, back-to-back Zener diodes (ZD1, ZD2) are used to make one more path to clamp the voltage to protect other components. In FIG. 4A and FIG. 4C, when the first switch Q1 is turned on to provide the first current path Li1 or the second switch Q2 is turned on to provide the second current path Li2, a voltage across two ends of the current transform unit 1 may be less than 5 volts. However, in FIG. 4B and FIG. 4D, due to the need for quick reset flux of the flux reset circuit 3, the voltage across two ends of the current transform unit 1 may be greater than 10 volts. Especially used in high-wattage switching converters, the voltage across two ends of the current transform unit 1 may instantly increase to more than 30 volts, and therefore it may be difficult to clamp the voltage across the current transform unit 1 through a single Zener diode (ZD1, ZD2). Accordingly, the Zener diodes (ZD1, ZD2) may be adjusted with the wattage of the switching converter. In high-wattage applications, multiple Zener diodes (ZD1, ZD2) may be connected in series to increase the cross voltage when the Zener diodes (ZD1, ZD2) break down.

Figure 6B:
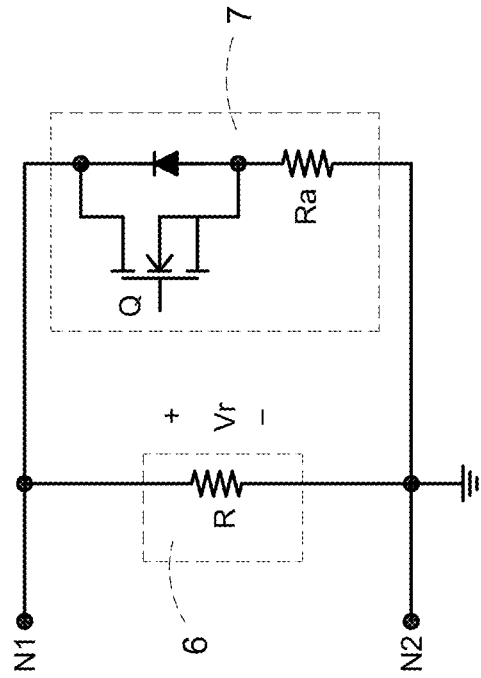
FIG. 6B is a circuit diagram of showing current detection according to a second embodiment of the present disclosure.
Figure 6A:
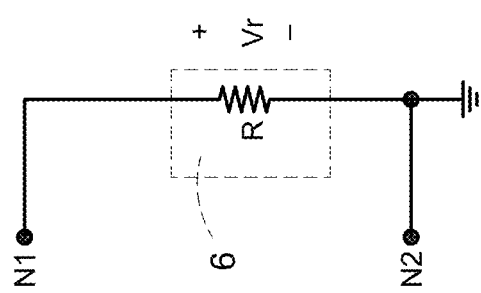
FIG. 6A is a circuit diagram of showing current detection according to a first embodiment of the present disclosure.

Please refer to FIG. 6A, which shows a circuit diagram of showing current detection according to a first embodiment of the present disclosure, FIG. 6B, which shows a circuit diagram of showing current detection according to a second embodiment of the present disclosure, and also refer to FIG. 1 to FIG. 5C. As shown in FIG. 6A, a preferred embodiment of the detection unit 6 may be a detection resistor R, and a current flows through the first node N1 and the second node N2 to produce the cross voltage Vr. The cross voltage Vr is corresponding to a magnitude of the input current Iin. Therefore, the magnitude of the input current Iin can be accurately acquired by detecting the cross voltage Vr. In one embodiment, the detection unit 6 is not limited to the detection resistor R. For example, all electronic components or circuits that can generate a cross voltage Vr corresponding to the input current Iin across two ends of the detection unit 6 should be included in the scope of this embodiment.

As shown in FIG. 6B, the current detection circuit 100 further includes a multiple ratio adjustment circuit 7. The multiple ratio adjustment circuit 7 is coupled to the detection unit 6, and is used to adjust a resistance of the detection unit 6 according to the magnitude of the input current Iin. Specifically, since the magnitude of the input current Iin will vary according to the wattage and input voltage Vin of the switching power conversion circuit 200, the existing detection unit 6 may be difficult to accurately detect the input current Iin due to insufficient current magnification. Accordingly, it is a preferred embodiment to use the multiple ratio adjustment circuit 7 coupled to the detection unit 6 to adjust the current magnification. Therefore, when the input current Iin is greater than the predetermined current, the multiple ratio adjustment circuit 7 is used to reduce the impedance value of the detection unit 6 to provide a general current magnification. Otherwise, the detection unit 6 is used to detect the input current Iin to provide a larger current magnification.

Moreover, the preferred implementation of the multiple ratio adjustment circuit 7 is that the multiple ratio adjustment circuit 7 includes a switch Q and a multiple ratio adjustment resistor Ra. The switch Q is coupled to a first end of the detection unit 6 and the control unit 5, a first end of the multiple ratio adjustment resistor Ra is coupled to the switch Q, and a second end of the multiple ratio adjustment resistor Ra is coupled to a second end of the detection unit 6. The control unit 5 may set a predetermined current, and control the switch Q to be turned on according to the input current Iin being greater than or equal to the predetermined current so as to reduce the impedance value of the detection unit 6 to provide a general current magnification. Otherwise, the switch Q is controlled to be turned off to maintain the impedance value of the detection unit 6 to provide a larger current magnification. In one embodiment, the multiple ratio adjustment circuit 7 is not limited to the series-connected switch Q and the multiple ratio adjustment resistor Ra. All electronic components or circuits that can adjust the impedance of the detection unit 6 should be included in the scope of this embodiment.

Figure 7A:
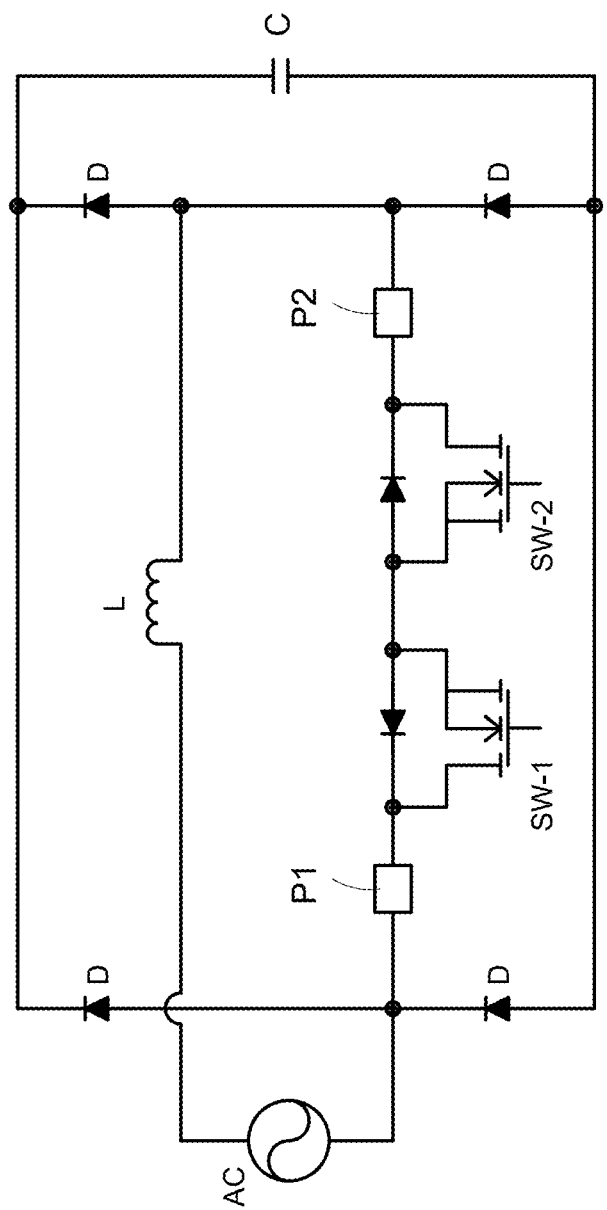
FIG. 7A is a circuit diagram of applying the current detection circuit according to a first embodiment of the present disclosure.
Figure 7B:
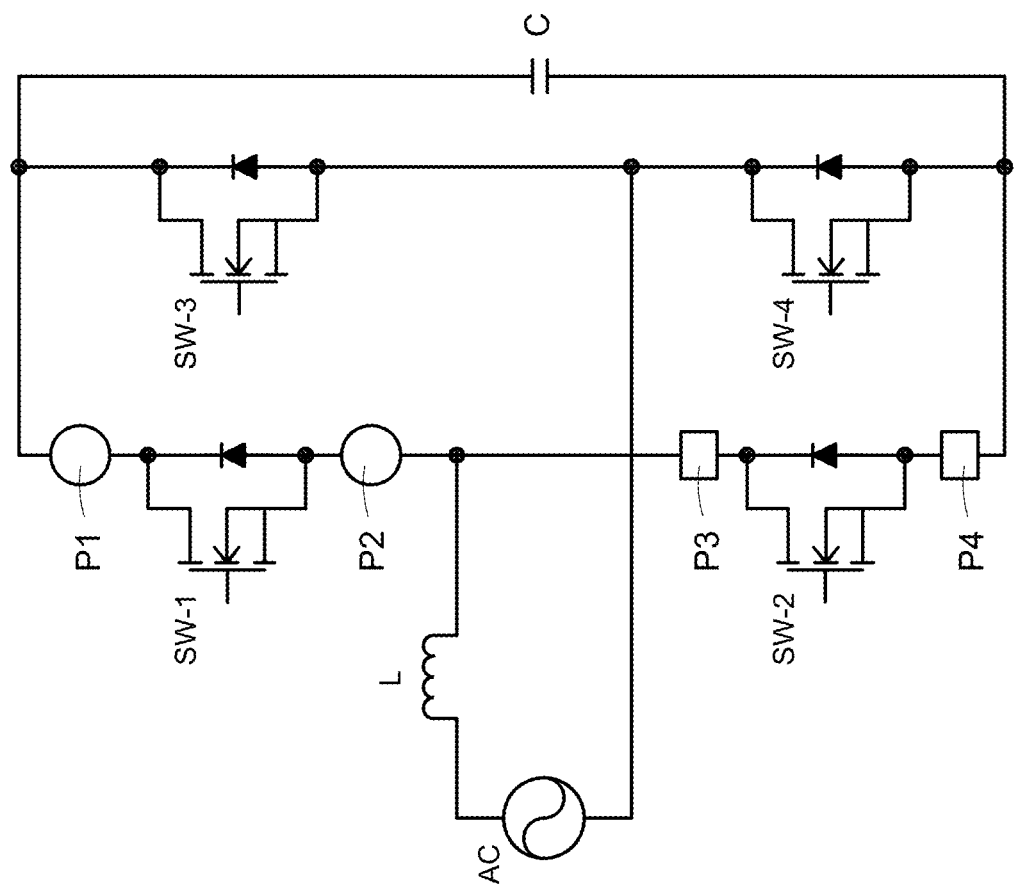
FIG. 7B is a circuit diagram of applying the current detection circuit according to a second embodiment of the present disclosure.
Figure 7C:
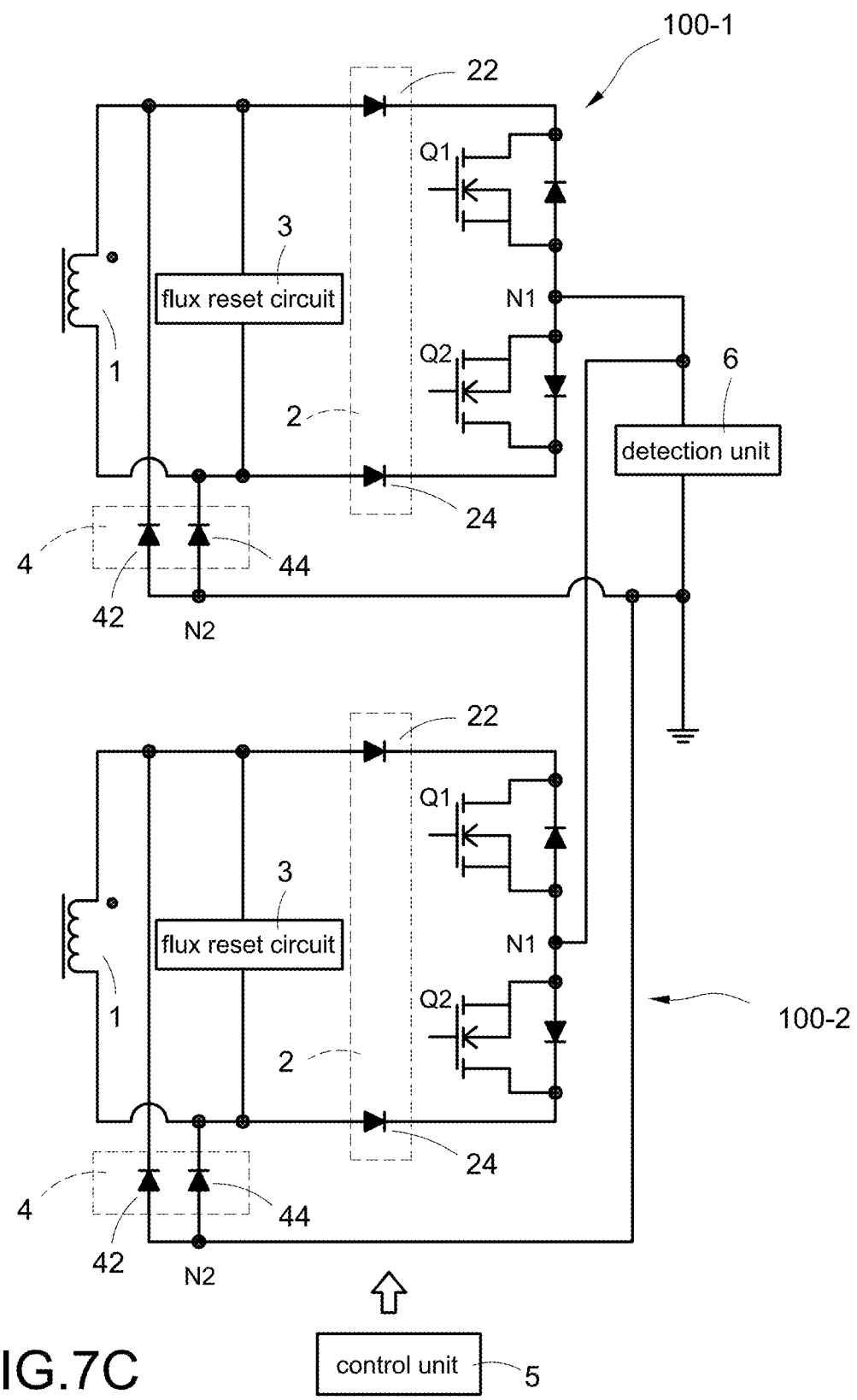
FIG. 7C is a circuit diagram of applying the current detection circuit according to a third embodiment of the present disclosure.

Please refer to FIG. 7A, which shows a circuit diagram of applying the current detection circuit according to a first embodiment of the present disclosure, FIG. 7B, which shows a circuit diagram of applying the current detection circuit according to a second embodiment of the present disclosure, FIG. 7C, which shows a circuit diagram of applying the current detection circuit according to a third embodiment of the present disclosure, and also refer to FIG. 2 to FIG. 6B. In the embodiment of FIG. 7A, a bridgeless power factor correction circuit is shown, power switches (SW-1, SW-2) may operate regardless of the positive or negative half cycle of the input voltage Vin. Since the current detection circuit 100 only needs to turn on the corresponding switches (Q1, Q2) according to the positive and negative half cycles, only one current detection circuit 100 is coupled to the position P1 or the position P2 shown in FIG. 7A to completely detect the input current Iin in the positive and negative half cycles. There is no need to add a set of current transform unit and their corresponding control methods as in the conventional circuit in FIG. 1. Therefore, the circuit itself is simple and easy to control.

In the embodiment of FIG. 7B, a Totem Pole power factor correction circuit is shown, and features of this circuit is that power switches (SW-1, SW-4) and power switch (SW-2, SW-3) respectively operate according to the positive or negative half cycle of the input voltage Vin. The current detection circuit 100 is coupled to the position P1 or the position P2 shown in FIG. 7B to detect the complete input current Iin in the positive half cycle, or is coupled to the position P3 or the position P4 to detect the complete input current Iin in the negative half cycle. Afterward, according to the waveform of the input current Iin in the single half cycle, the waveform in the other half cycle can be estimated. Alternatively, as shown in FIG. 7C, the detection point of one of the current detection circuits (100-1, 100-2) is coupled to the position P1 or the position P2 shown in FIG. 7B, and the detection point of the other current detection (100-1, 100-2) is coupled to the position P3 or the position P4 shown in FIG. 7B, and the first nodes N1 of the current detection circuits (100-1, 100-2) are coupled at the same point, and the second nodes N2 of the current detection circuits (100-1, 100-2) are coupled at the same point. By using the shared detection unit 6 to detect the complete waveform of the input current Iin in the positive and negative half cycles.

Figure 8A:
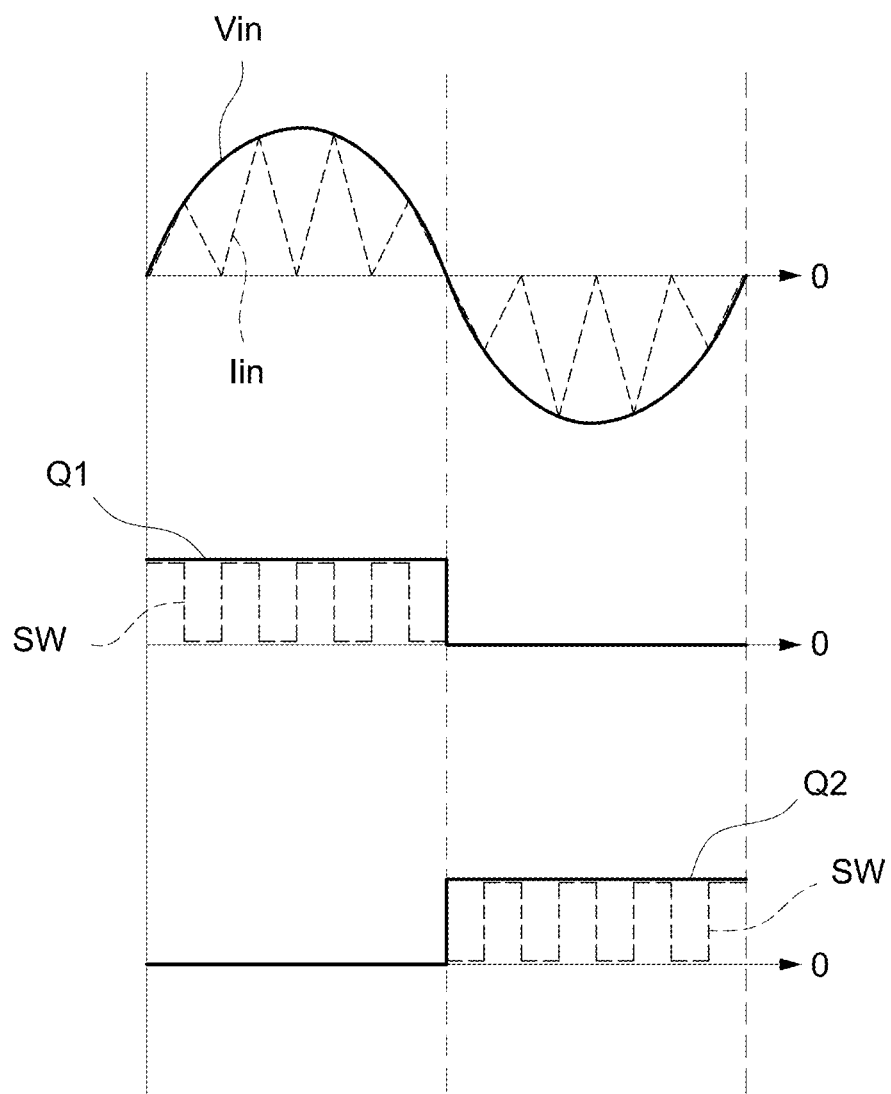
FIG. 8A is a waveform of applying the current detection circuit to a power factor correction circuit according to the present disclosure.
Figure 8B:
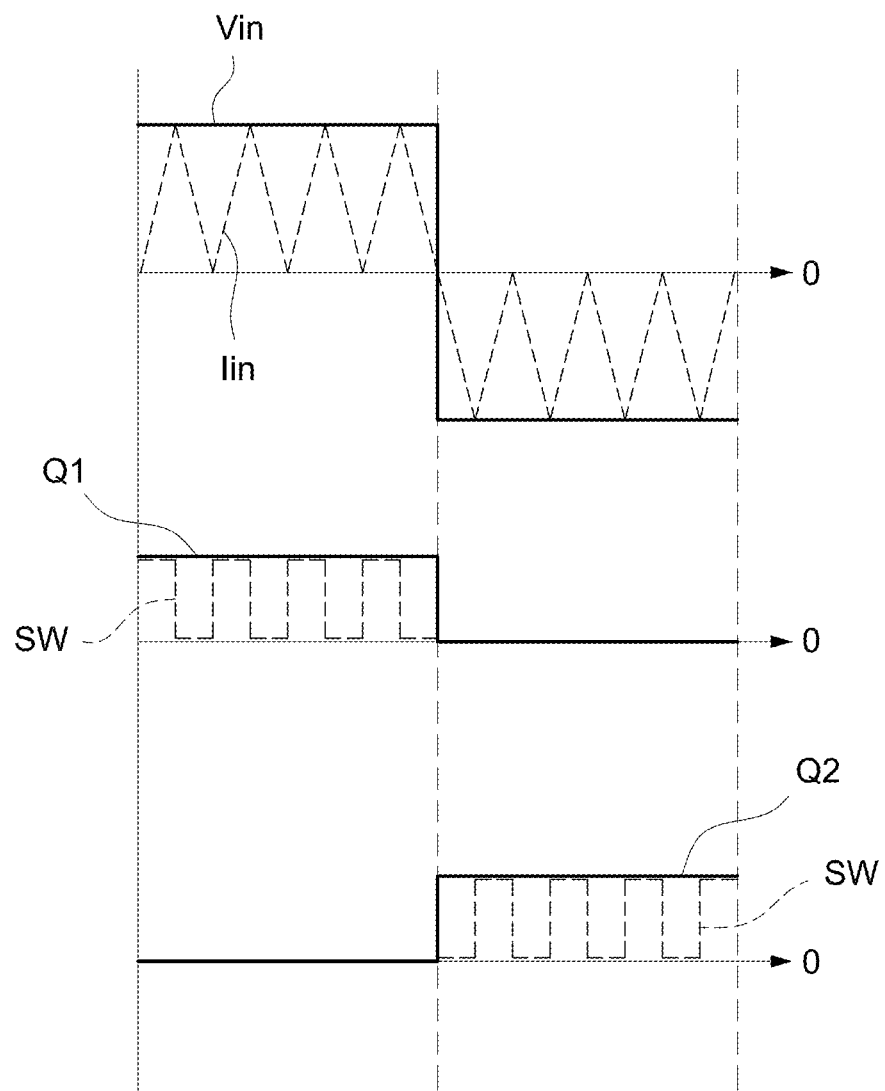
FIG. 8B is a waveform of applying the current detection circuit to a DC conversion circuit according to the present disclosure.

Please refer to FIG. 8A, which shows a waveform of applying the current detection circuit to a power factor correction circuit according to the present disclosure, FIG. 8B, which shows a waveform of applying the current detection circuit to a DC conversion circuit according to the present disclosure, and also refer to FIG. 2 to FIG. 7C. The waveform shown in FIG. 8A is applied to the power factor correction circuit, and the input voltage Vin is alternating current (AC) including a positive half cycle and a negative half cycle. The power factor correction circuit generates an input current Iin by switching the power switch SW. For ease of illustration, FIG. 8A is shown with a larger triangular wave. However, in fact, the power switch SW is high-frequency switching, which should be a high-density triangular wave. When the input voltage Vin is in the positive half cycle, the control unit 5 turns on the first switch Q1. When the first switch Q1 is turned on and the power switch SW is also turned on, the input current Iin rises (that is, the rising edge of the triangular wave). At this condition, the current detection circuit 100 generates a first current path Li1. Otherwise, when the first switch Q1 is turned on but the power switch SW is turned off, the input current Iin decreases (that is, the falling edge of the triangular wave). At this condition, the current detection circuit 100 generates a first flux reset path Lv1. This is also similar when the input voltage Vin is in the negative half cycle, and the detail description is omitted here for conciseness.

The waveform shown in FIG. 8B is applied to the DC conversion circuit, and the input voltage Vin is direct current (DC) including a positive voltage and a negative voltage. There is usually only one, including both for convenience. As shown in FIG. 8A, the power switch SW is high-frequency switching. When the input voltage Vin is the positive voltage, the control unit 5 turns on the first switch Q1. When the first switch Q1 is turned on and the power switch SW is also turned on, the input current Iin rises (that is, the rising edge of the triangular wave). At this condition, the current detection circuit 100 generates a first current path Li1. Otherwise, when the first switch Q1 is turned on but the power switch SW is turned off, the input current Iin decreases (that is, the falling edge of the triangular wave). At this condition, the current detection circuit 100 generates a first flux reset path Lv1. This is also similar when the input voltage Vin is in the negative half cycle, and the detail description is omitted here for conciseness.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A current detection circuit, configured to detect an input current of a switching power conversion circuit, the current detection circuit comprising:
   a current transform unit, having a primary-side winding and a secondary-side winding, the primary-side winding coupled to a power switch of the switching power conversion circuit,
   a first unidirectional conduction component assembly, connected to the secondary-side winding in parallel, comprising a first unidirectional conduction component and a second unidirectional conduction component reversely connected in series at a first node, a flux reset circuit, connected to the secondary-side winding in parallel, and configured to provide a flux reset path of the current transform unit, a second unidirectional conduction component assembly, connected to the secondary-side winding in parallel, comprising a third unidirectional conduction component and a fourth unidirectional conduction component reversely connected in series; the third unidirectional conduction component being coupled to the first unidirectional conduction component with opposite polarity, and the third unidirectional conduction component and the fourth unidirectional conduction component being connected at a second node, a first switch, connected to the first unidirectional conduction component or the fourth unidirectional conduction component in series, a second switch, connected to the second unidirectional conduction component or the third unidirectional conduction component in series, a control unit, configured to turn on or turn off the first switch and the second switch, and a detection unit, coupled to the first node and the second node, wherein when the first switch is turned on, the secondary-side winding, the first unidirectional conduction component, the fourth unidirectional conduction component, the first switch, and the detection unit form a first current path; when the second switch is turned on, the secondary-side winding, the second unidirectional conduction component, the third unidirectional conduction component, the second switch, and the detection unit form a second current path.

2. The current detection circuit as claimed in claim 1, wherein the control unit correspondingly controls the first switch and the second switch according to a first direction voltage or a second direction voltage of an input voltage, and the first direction and the second direction are in the opposite direction of a zero voltage.

3. The current detection circuit as claimed in claim 2, wherein the control unit turns on the first switch and turns off the second switch according to the first direction voltage, and turns on the second switch and turns off the first switch according to the second direction voltage.

4. The current detection circuit as claimed in claim 1, wherein a first end of the secondary-side winding forms a first flux reset path through the flux reset circuit, and a second end of the secondary-side winding forms a second flux reset path through the flux reset circuit.

5. The current detection circuit as claimed in claim 1, wherein the flux reset circuit comprises:
a flux reset resistor.

6. The current detection circuit as claimed in claim 1, wherein the flux reset circuit comprises:
a first Zener diode, a first end of the first Zener diode coupled to a first end of the secondary-side winding, and
a second Zener diode, a first end of the second Zener diode coupled to a second end of the first Zener diode, and a second end of the second Zener diode coupled to a second end of the secondary-side winding,
wherein a polarity of the first Zener diode is opposite to a polarity of the second Zener diode.

7. The current detection circuit as claimed in claim 1, wherein the detection unit comprises:

a detection resistor, configured to generate a cross voltage corresponding to the input current.

8. The current detection circuit as claimed in claim 7, further comprising:
a multiple ratio adjustment circuit, coupled to the detection unit in parallel and configured to adjust a resistance value of the detection unit.

9. The current detection circuit as claimed in claim 8, wherein the multiple ratio adjustment circuit comprises:
a switch, and
a multiple ratio adjustment resistor, coupled to the switch in series,
wherein the control unit turns on the switch when the magnitude of the input current is greater than or equal to a predetermined current.

10. The current detection circuit as claimed in claim 1, wherein the switching power conversion circuit is a bridgeless power factor correction circuit.

11. The current detection circuit as claimed in claim 1, wherein the switching power conversion circuit is a Totem-Pole power factor correction circuit.

12. The current detection circuit as claimed in claim 1, wherein the switching power conversion circuit is a DC conversion circuit.

13. A current detection method, configured to control a current detection circuit to detect an input current of a switching power conversion circuit; the current detection circuit comprising a current transform unit, a flux reset circuit, a first unidirectional conduction component and a second unidirectional conduction component reversely connected in series, a third unidirectional conduction component and a fourth unidirectional conduction component reversely connected in series, a first switch, and a second switch, the current detection method comprising steps of:
turning on the first switch according to a first direction of an input voltage of the switching power conversion circuit to generate a first current path formed by the current transform unit, the first unidirectional conduction component, and the fourth unidirectional conduction component, and a first flux reset path formed through the flux reset circuit from the current transform unit,
turning on the second switch according to a second direction of the input voltage to generate a second current path formed by the current transform unit, the second unidirectional conduction component, and the third unidirectional conduction component, and a second flux reset path formed through the flux reset circuit from the current transform unit, and
measuring a cross voltage between a first node between the first unidirectional conduction component and the second unidirectional conduction component and a second node between the third unidirectional conduction component and the fourth unidirectional conduction component to acquire the input current corresponding to the cross voltage,
wherein the first direction and the second direction are in the opposite direction of a zero voltage.

14. The current detection method as claimed in claim 13, further comprising a step of:
turning off the second switch according to the turned-on first switch.

15. The current detection method as claimed in claim 13, further comprising a step of:
maintaining a voltage across two ends of the flux reset circuit as a first clamping voltage according to the first flux reset path.

16. The current detection method as claimed in claim 13, further comprising a step of:
  turning off the first switch according to the turned-on second switch.

17. The current detection method as claimed in claim 13, further comprising a step of:
  maintaining a voltage across two ends of the flux reset circuit as a second clamping voltage according to the second flux reset path.

18. The current detection method as claimed in claim 13, further comprising a step of:
  adjusting an impedance value between the first node and the second node according to a magnitude of the input current.

* * * * *